US006400649B2

(12) United States Patent
Skinner et al.

(10) Patent No.: US 6,400,649 B2
(45) Date of Patent: Jun. 4, 2002

(54) SELF BIASED TRANSDUCER ASSEMBLY AND HIGH VOLTAGE DRIVE CIRCUIT

(75) Inventors: Colin W. Skinner, Castaic; Qi-Chang Xu, Stevenson Ranch, both of CA (US)

(73) Assignee: L3 Communications Corporation, Sylmar, CA (US)

( * ) Notice: Subject to any disclaimer, the term of this patent is extended or adjusted under 35 U.S.C. 154(b) by 0 days.

(21) Appl. No.: 09/841,515

(22) Filed: Apr. 24, 2001

Related U.S. Application Data

(62) Division of application No. 09/276,030, filed on Mar. 25, 1999.

(51) Int. Cl.[7] ........................ H04R 17/00; H01L 41/083

(52) U.S. Cl. ........................ 367/162; 367/165; 367/173; 367/176; 310/346

(58) Field of Search ................................ 367/162, 165, 367/173, 176, 152, 157; 310/346, 328, 366

(56) References Cited

U.S. PATENT DOCUMENTS 3,673,442 A * 6/1972 Sonderegger ............... 310/346
3,683,211 A * 8/1972 Perlman et al. ............. 310/346
3,753,373 A 8/1973 Brown ........................ 73/398
3,775,737 A 11/1973 Laurent ...................... 340/7 R
3,947,802 A 3/1976 Tims et al. ................... 340/10
4,101,795 A * 7/1978 Fukumoto et al. .......... 367/152
4,525,645 A 6/1985 Shirley et al. .............. 310/337
4,845,688 A 7/1989 Butler ........................ 367/174
4,894,811 A 1/1990 Porzio ........................ 367/174
4,992,999 A 2/1991 Yerby et al. ................ 367/130
5,081,391 A 1/1992 Owen ......................... 310/334
5,225,731 A 7/1993 Owen ......................... 310/366
5,239,518 A 8/1993 Kazmar ...................... 367/157
5,497,357 A 3/1996 Dahlstrom et al. ......... 367/158
5,926,439 A 7/1999 Piquette ..................... 367/161

* cited by examiner

*Primary Examiner*—Ian J. Lobo
(74) *Attorney, Agent, or Firm*—Roberts & Mercanti, LLP

(57) ABSTRACT

An improved transducer arrangement for low frequency sonar projectors that convert electric signals to mechanically generated acoustic signals. In one embodiment the arrangement has both a convex flextensional transducer and a concave flextensional transducer. An open side of the convex transducer is attached to an open side of the concave transducer by an intermediate bulkhead which closes each of the attached open sides. An end plate is attached to another open side of the convex transducer and another end plate is attached to another open side of the concave transducer such that the end plates close the attached open sides. In another embodiment, transducer assembly has a convex transducer having end plates and a concave transducer having end plates. Either one of the endplates of the concave transducer is attached to one of the endplates of the convex transducer, or an endplate of the concave transducer is also an endplate of the concave transducer. There is also provided a transducer drive circuit including one of the transducer assemblies wherein the convex transducer is electrically connected in series with the concave transducer. Means are provided for positively direct current biasing the convex transducer or the concave transducer and oppositely negatively direct current biasing the concave transducer or the convex transducer. Further means apply an alternating current driving signal to each of the convex transducer and the concave transducer. This configuration provides an improvement over the prior art in reduced transducer size and weight by doing away with a large isolation capacitor from the drive circuitry.

8 Claims, 6 Drawing Sheets

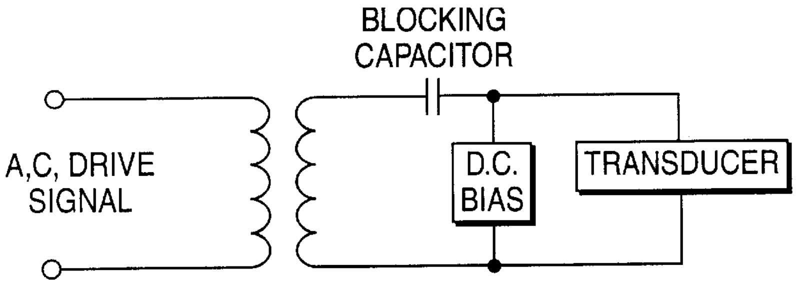
FIG. 6
PRIOR ART
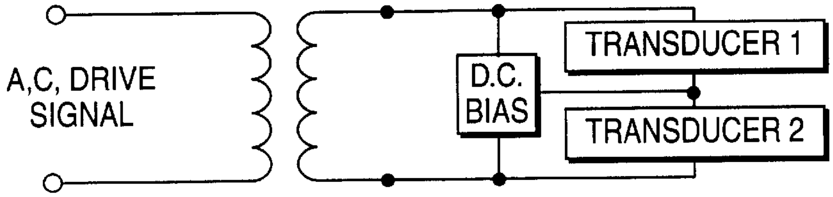
FIG. 7
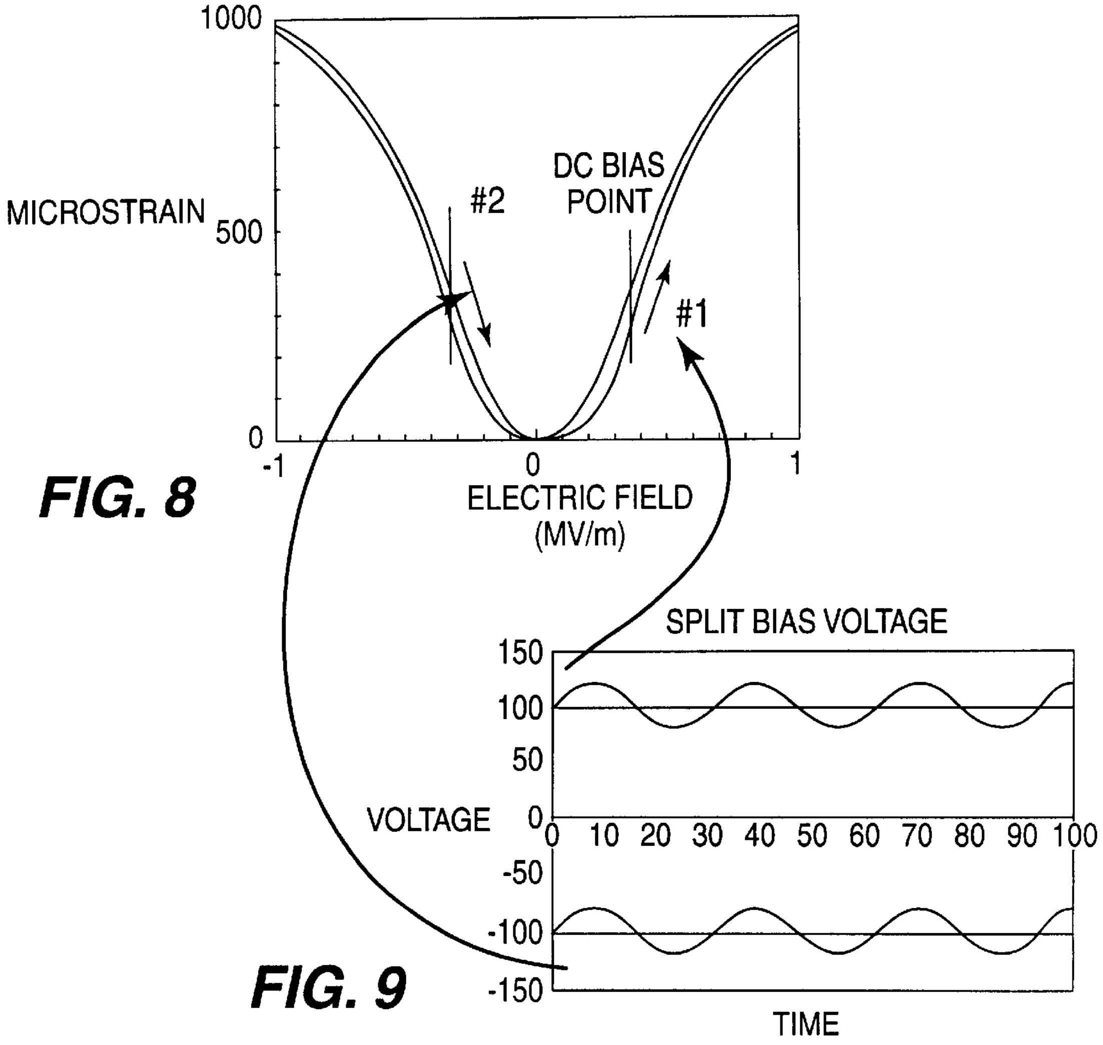
FIG. 8
FIG. 9

SELF BIASED TRANSDUCER ASSEMBLY AND HIGH VOLTAGE DRIVE CIRCUIT

This application is a Division of U.S. patent application Ser. No. 09/276,030, filed Mar. 25, 1999.

BACKGROUND OF THE INVENTION

1. Field of the Invention

The present invention relates to transducers. More specifically, the invention relates to an improved transducer arrangement for low frequency sonar projectors that convert electrical signals to mechanically generated acoustic signals.

2. Description of the Prior Art

Transducers are employed as part of sonar devices which are used to detect underwater objects. Such transducers may be either a projector or a receiver. A projector is a sonar transmitter which converts electrical signals to mechanical vibrations, while a receiver conversely intercepts reflected mechanical vibrations and converts them into electrical signals. Projector transmitter and receiver arrays are formed from multiple projectors and receivers which are then utilized in conjunction with a sea craft to detect underwater objects.

A projector comprises an electromechanical stack of ceramic elements having a particular crystalline structure. Ceramic projectors must be operated in an optimal temperature range to provide good performance. Depending on the ceramic crystal structure, a projector may be either piezoelectric or electrostrictive. If the ceramic crystal is subjected to a high direct current voltage during the manufacturing process, the ceramic crystal becomes permanently polarized and operates as a piezoelectric. An electrical signal then applied to the ceramic stack generates mechanical vibrations. Alternatively, direct current voltage can be temporarily applied to the ceramic stack during operation to provide polarization of the crystal. Under these conditions, the operation of the projector is electrostrictive. After the application of the direct current voltage is discontinued, the electrorestrictive ceramic stack is no longer polarized.

Many different types of sonar projectors are known. One type of projector is a flextensional sonar projector which comprises a low frequency transducer. A low frequency transducer exhibits low attenuation of the acoustic signals in sea water. In general, a ceramic stack is housed within an elliptical-shaped outer projector shell. Vibration of the ceramic stack caused by application of an electrical signal produces magnified vibrations in the outer projector shell. Thereafter, the vibrations generate acoustic waves in the sea water.

Present mobile surveillance systems employ large, heavy arrays of low frequency high power Class IV flextensional transducers to provide the required source level, directivity, and bandwidth. High temperature Lead Magnesium Niobate (PMN) ceramics in a flextensional transducer are capable of developing much greater levels of voltage induced strain than prior art transducers, thus producing higher source levels of output from a projector. Replacement of driver material in a flextensional transducer can therefore be used to increase the power level without affecting the resonant frequency or frequency bandwidth of the device. Because PMN is a ferroelectric material it must be biased with a DC voltage during operation. Such flextensional sonar projectors require a large voltage DC bias capacitor to isolate the high voltage DC from a power amplifier and pass the high voltage AC which drives the transducer. Previous implementations of PMN driven transducers have used a bank of blocking capacitors to isolate a DC bias voltage from the AC drive voltage. The blocking capacitors are large and expensive, weighing as much as 30% of the transducer and must be physically located near the transducers. In order to accommodate evolving needs, smaller and lighter weight projector arrays are required.

The invention provides an improved push-pull transducer arrangement and an improved drive circuit which eliminates the need for the isolation capacitor. The transducer arrangement provides two attached transducers which utilizes a split bias technique to eliminate the heretofore required capacitor. The transducers operate out of phase from each other electrically but in phase with each other acoustically. Each transducer has approximately the same impedance over the operating band to create a balance of power output. In effect, the invention eliminates the blocking capacitors by utilizing two electrically out-of-phase transducer drivers to bias one another. The two drivers are used in a "push-pull" configuration within two different shells which have slightly different resonant frequencies. This coupled dual resonant system also significantly increases the frequency bandwidth of the transducer arrangement. Thus, an improvement in system size and weight is attained by eliminating the capacitors and a significantly increasing bandwidth is also achieved. Such a reduced weight, broad bandwidth transducer arrangement significantly reduces the size and cost of low frequency projector systems.

SUMMARY OF THE INVENTION

The invention provides a push-pull electro-acoustic transducer assembly which comprises:

a) a convex flextensional transducer which comprises a hollow, elliptical shell comprising a pair of convex side walls meeting at opposing ends; said walls and ends delineating opposing open sides; a piezoelectric ceramic stack positioned in the hollow elliptical shell and extending between the opposing ends and adapted to exert a force on the opposing ends and strain the convex side walls when the stack is subjected to sufficient driving voltage through electrodes bonded to the stack;

b) a concave flextensional transducer which comprises a hollow, hyperbolic shell comprising a pair of concave side walls each connected to opposing end walls; said side walls and end walls delineating opposing open sides; a piezoelectric ceramic stack positioned in the hollow, hyperbolic shell and extending between the opposing ends and adapted to exert a force on the opposing ends and strain the concave side walls when the stack is subjected to sufficient driving voltage through electrodes bonded to the stack;

c) one open side of the convex transducer being attached to an open side of the concave transducer by an intermediate bulkhead, which bulkhead closes each of said attached open sides; and d) an end plate attached to another open side of the convex transducer shell and another end plate attached to another open side of the concave transducer shell, which end plates close said attached open sides.

The invention also provides a transducer drive circuit which comprises:

i) a push-pull electro-acoustic transducer assembly which comprises:

a) a convex flextensional transducer which comprises a hollow, elliptical shell comprising a pair of convex side walls meeting at opposing ends; said walls and ends delineating opposing open sides; a piezoelectric ceramic stack positioned in the hollow elliptical shell and extending between the opposing ends and adapted to exert a force on the opposing ends and strain the convex side walls when the stack is subjected to sufficient driving voltage through electrodes bonded to the stack;

b) a concave flextensional transducer which comprises a hollow, hyperbolic shell comprising a pair of concave side walls each connected to opposing end walls; said side walls and end walls delineating opposing open sides; a piezoelectric ceramic stack positioned in the hollow, hyperbolic shell and extending between the opposing ends and adapted to exert a force on the opposing ends and strain the concave side walls when the stack is subjected to sufficient driving voltage through electrodes bonded to the stack;

c) one open side of the convex transducer being attached to an open side of the concave transducer by an intermediate bulkhead, which bulkhead closes each of said attached open sides; and d) an end plate attached to another open side of the convex transducer shell and another end plate attached to another open side of the concave transducer shell, which end plates close said attached open sides;

said convex transducer being electrically connected in series with said concave transducer;

ii) means for positively direct current biasing the convex transducer or the concave transducer and oppositely negatively direct current biasing the concave transducer or the convex transducer;

iii) means for applying an alternating current driving signal to each of the convex transducer and the concave transducer.

The invention further provides a push-pull electro-acoustic transducer assembly which comprises:

a) a convex flextensional transducer which comprises a hollow parabolic shell of revolution comprising a plurality of convex side wall staves having ends which are attached at endplates at opposing ends of the parabolic shell; a piezoelectric ceramic stack positioned in the hollow parabolic shell and extending between the opposing ends and adapted to exert a force on the opposing endplates and strain the convex side wall staves when the stack is subjected to sufficient driving voltage through electrodes bonded to the stack;

b) a concave flextensional transducer which comprises a hollow, hyperbolic shell of revolution comprising a plurality of concave side wall staves having ends which are attached at endplates at opposing ends of the hyperbolic shell; a piezoelectric ceramic stack positioned in the hollow, hyperbolic shell and extending between the opposing ends and adapted to exert a force on the opposing endplates and strain the concave side wall staves when the stack is subjected to sufficient driving voltage through electrodes bonded to the stack;

c) wherein either one of the endplates of the concave transducer is attached to one of the endplates of the convex transducer, or an endplate of the concave transducer is also an endplate of the concave transducer.

The invention still further provides a transducer drive circuit which comprises:

i) a push-pull electro-acoustic transducer assembly which comprises a) a convex flextensional transducer which comprises a hollow parabolic shell of revolution comprising a plurality of convex side wall staves having ends which are attached at endplates at opposing ends of the convex staves; a piezoelectric ceramic stack positioned in the hollow parabolic shell and extending between the opposing endplates and adapted to exert a force on the opposing endplates and strain the convex side wall staves when the stack is subjected to sufficient driving voltage through electrodes bonded to the stack;

b) a concave flextensional transducer which comprises a hollow, hyperbolic shell of revolution comprising a plurality of concave side wall staves having ends which are attached at endplates at opposing ends of the concave staves; a piezoelectric ceramic stack positioned in the hollow, hyperbolic shell and extending between the opposing endplates and adapted to exert a force on the opposing endplates and strain the concave side wall staves when the stack is subjected to sufficient driving voltage through electrodes bonded to the stack;

c) wherein either one of the endplates of the concave transducer is attached to one of the endplates of the convex transducer, or an endplate of the concave transducer is also an endplate of the concave transducer;

said convex transducer being electrically connected in series with said concave transducer;

ii) means for positively direct current biasing the convex transducer or the concave transducer and oppositely negatively direct current biasing the concave transducer or the convex transducer;

iii) means for applying an alternating current driving signal to each of the convex transducer and the concave transducer.

The invention also provides a stack of piezoelectric ceramic elements, each having a substantially equivalent thickness, each of said elements being attached to the next element through an intermediate electrically conductive electrode; a terminal piezoelectric ceramic member attached on one side thereof to at least one end of said stack through an intermediate electrically conductive electrode, each terminal piezoelectric member having a thickness which is about 25% or more greater than the thickness of said elements; and an electrically insulating segment attached to each terminal piezoelectric member on an opposite side of said member.

The invention still further provides a transducer which comprises a hollow shell comprising a pair of side walls meeting at opposing ends; a piezoelectric ceramic stack positioned in the hollow shell and extending between the opposing ends and adapted to exert a force on the opposing ends and strain the side walls when the stack is subjected to sufficient driving voltage through electrodes bonded to the stack; said stack comprises a plurality of piezoelectric ceramic elements, each having a substantially equivalent thickness, each of said elements being attached to the next element through an intermediate electrically conductive electrode; a terminal piezoelectric ceramic member attached on one side thereof to at least one end of said stack through an intermediate electrically conductive electrode, each terminal piezoelectric member having a thickness which is about 25% or more greater than the thickness of said elements; and an electrically insulating segment attached to each terminal piezoelectric member on an opposite side of said member.

The invention yet further provides push-pull slotted cylinder transducer which comprises an inner piezoelectric slotted cylinder and an outer concentric piezoelectric slotted cylinder, said piezoelectric slotted cylinders being separated by an intermediate concentric nonpiezoelectric slotted cylinder; said slotted cylinders being enclosed by an insulating cylinder; means for applying sufficient driving voltage to the piezoelectric slotted cylinders through electrodes bonded to each of the piezoelectric slotted cylinders.

BRIEF DESCRIPTION OF THE DRAWINGS

FIG. 6 shows an electrical schematic diagram of prior art circuitry.

FIG. 7 shows an electrical schematic diagram of circuitry according to the invention.

FIG. 8 shows a strain vs. field curve which demonstrates how each of the two transducer segments are electrically biased and driven.

FIG. 9 shows the combined AC-DC voltage on each of the two transducer segments.

DETAILED DESCRIPTION OF THE PREFERRED EMBODIMENT

Figure 1:
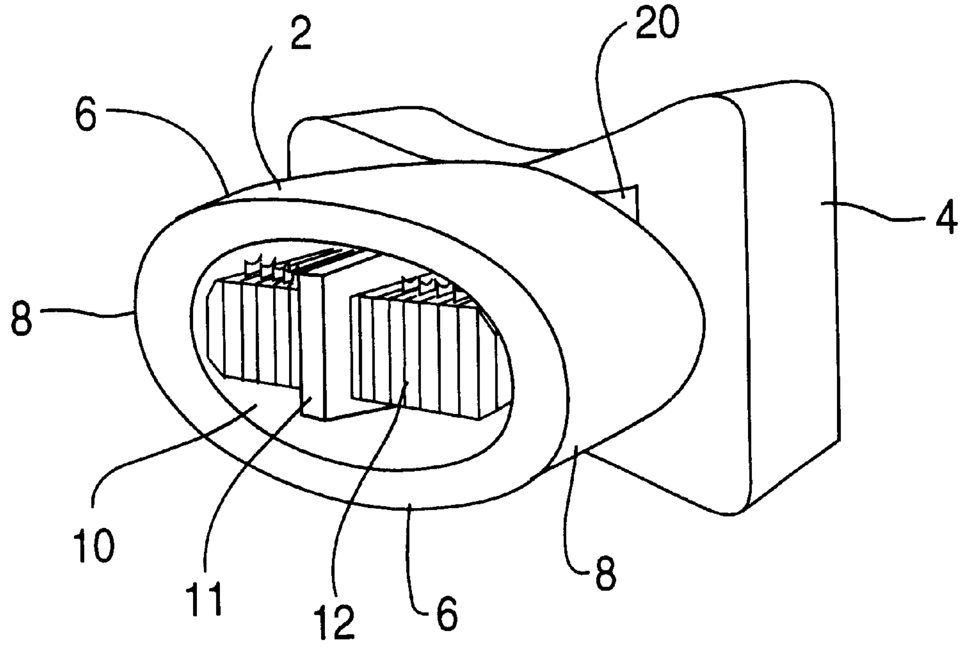
FIG. 1 shows a front perspective views of a first embodiment of a push-pull electro-acoustic transducer assembly according to the invention.
Figure 2:
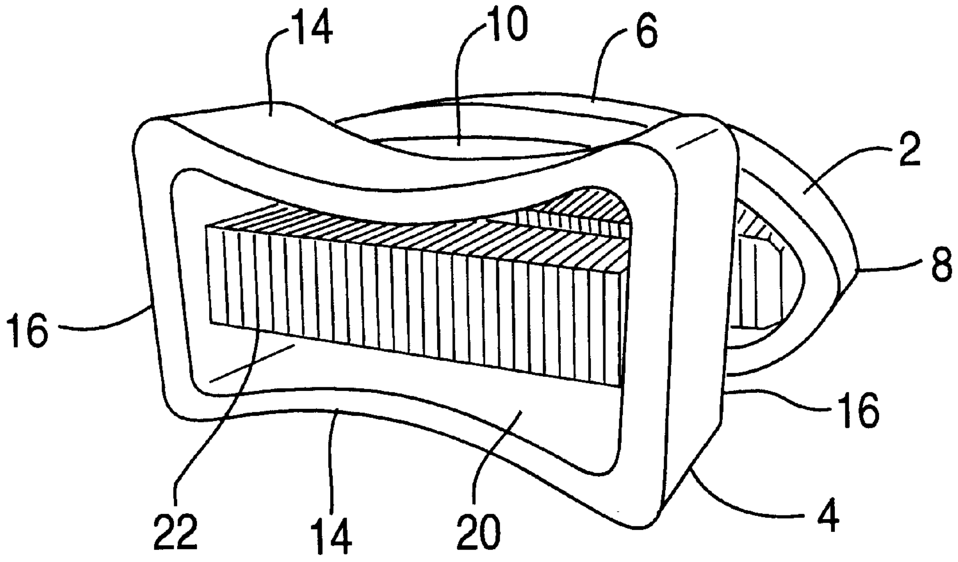
FIG. 2 shows a rear perspective views of a first embodiment of a push-pull electro-acoustic transducer assembly according to the invention.

FIGS. 1 and 2 show front and rear perspective views of a first embodiment of a push-pull electro-acoustic transducer assembly according to the invention. It comprises a convex flextensional transducer 2 attached to a concave flextensional transducer 4. The convex flextensional transducer 2 comprises a hollow, elliptical shell comprising a pair of convex side walls 6 meeting at opposing ends 8. The walls 6 and ends 8 delineate opposing open sides 10. A piezoelectric ceramic stack 12 is positioned in the hollow elliptical shell and extends between the opposing ends 8. Stack 12 exerts a force on the opposing ends 8 and strains the convex side walls 6 when the stack is subjected to sufficient driving voltage through electrodes bonded to the stack. Attached to the convex flextensional transducer 2 is a concave flextensional transducer 4 as shown. Transducer 4 comprises a hollow, generally hyperbolic shell comprising a pair of concave side walls 14 each connected to opposing end walls 16. Side walls 14 and end walls 16 delineate opposing open sides 20. A ceramic stack 22 is positioned in the hollow, hyperbolic shell and extends between the opposing ends 16 and exerts a force on the opposing ends 16 and strains the concave side walls 14 when the stack is subjected to sufficient driving voltage through electrodes bonded to the stack. The two transducers 2 and 4 are attached to one another such that one open side of the convex transducer 2 is attached to an open side of the concave transducer 4 by an intermediate bulkhead, not shown, such that the bulkhead closes each of the attached open sides. An end plate, not shown, is attached to the other open side of the convex transducer shell and another end plate attached to the other open side of the concave transducer shell such that the end plates close the open sides. Such attachment may be via optional center support 11. The bulkheads and end plates facilitate waterproofing the dissimilar shell shapes.

Figure 3:
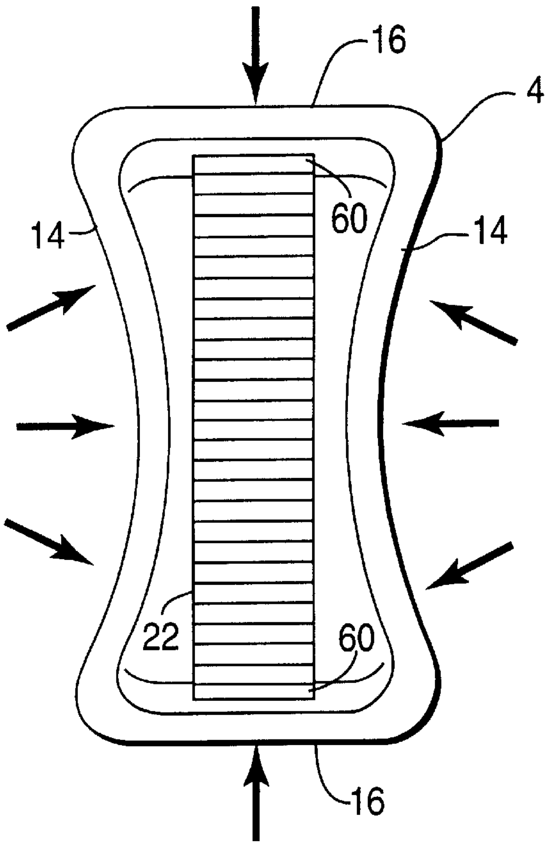
FIG. 3 shows a front view of a concave transducer according to one embodiment of the invention.
Figure 4:
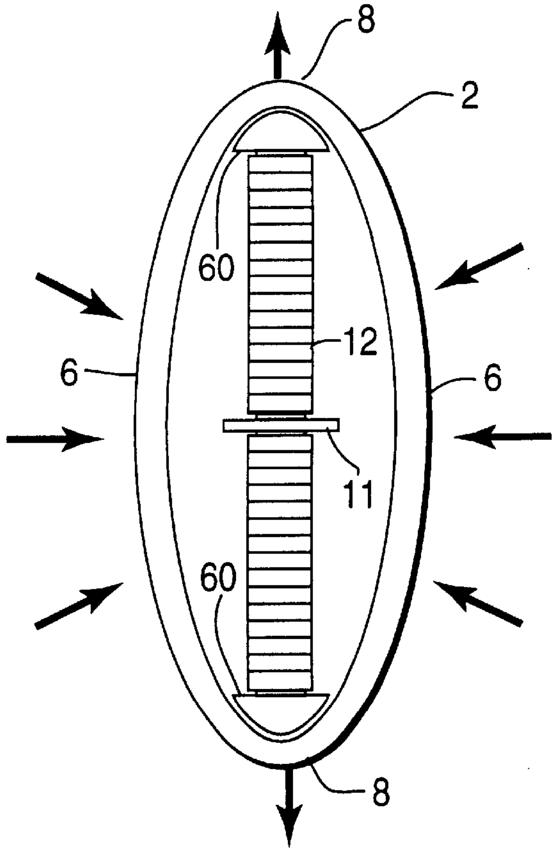
FIG. 4 shows a front view of a convex transducer according to one embodiment of the invention.

FIGS. 3 and 4 separately depict front views of the concave and convex transducers. The arrows illustrate how the driver motions are made to produce radiating surfaces. Each of the concave and a convex shells 2 and 4 may be composed of any suitable materials such as steel, aluminum, fiberglass or suitable polymeric materials. Wall thickness can be easily determined by those skilled in the art, however, wall thickness in the range of from about 0.25 inch to about 3 inches are useful. Each shell may have any convenient length and width, such as a height of from about 7 inches to about 4 feet and a width of from about 1.5 inches to about 2 feet.

The stacks 12 and 22 comprises a series of plates of suitable ceramic material such as electrostrictives, piezoelectrics and magnetostrictives. Preferred electrostrictives include lead magnesium niobates (PMN), lead magnesium niobate-lead titanate (PMN-PT), lead magnesium niobate-lead titanate-barium titanate (PMN-PT-BA), lead zirconate niobate (PZN), lead zirconate niobate-barium titanate (PZN-BA) and $Pb_{1-x}{}^{2+}La_x{}^{3+}(Zr_yTi_z)_{1-x/4}O_3$, (PLZT). Preferred piezoelectrics include lead zirconate titanate (PZT), barium titanate (BT) and $NbLiO_3$. Preferred are lead magnesium niobates (PMN), preferably lead magnesium niobate-lead titanate (PMN-PT) as is well known in the art. Preferably the lead magnesium niobate has a Curie temperature Tm approximately equal to the operating temperature of the electro-acoustic transducer. PMN-PT materials are particularly attractive in high power projector applications because they offer figure of merit improvements of up to 11 dB compared with conventional PZT. This increase can be used to produce higher peak source levels without significant impact to system size/weight, or it can be used to achieve comparable system performance in smaller, lighter weight arrays. The term PMN-PT is used to describe a family of ceramics whose electrostrictive properties vary widely. The ratio of Lead Titanate (PT) (and other materials) to PMN affects both the material performance (dielectric, loss tangent, coupling, etc) and the temperature at which these properties are maximized (Tm). A Tm=85° C. PMN material for the transducer is preferred. The material has excellent electrostrictive properties but also exhibits other mechanical and electrical properties which make it a more usable material than other PMN ceramics. PMN-PT compositions offer dramatically higher strain rates than PZT ceramics and thus higher acoustic source levels when used to drive a transducer. Other useful ceramic materials non-exclusively include PMNRT (Tm=25° C.), PMN-10/3 (Tm=85° C.), PMNHT (Tm=85° C.) and PZT8 (Tm=25° C.).

Each stack element is flat and preferably rectangular or circular and may range from about 0.5 inch to about 6 inches in length and width and from about 0.005 to about 0.5 inch in thickness. The total stack has a length which fits in the shell. Preferably the ends of each stack are provided with somewhat thicker stack end elements 56, as may be better seen in FIG. 17, to reduce stress caused by the lateral strain in the active ceramic which is bonded to inactive (insulator) ceramics 58. An end element 60 is bonded to the insulator ceramic 58 and is ground to a thickness that allows the stack to fit within the shell. These end elements 60 are preferably comprised of a steel-nickel alloy which has a low coefficient of thermal expansion such as INVAR which is commercially available from Soc. Anon. De Commentry-Fourchambault et Decazicille (Acieriesd'Imphy). Each stack element is attached to the next stack element as well as to the end elements by a suitable adhesive such as an epoxy which will not lose its adhesion during transducer operating conditions. The stack may operate at room temperature, below room temperature or above room temperature. The preferred operating temperature may range from about 10° C. to about 130° C., more preferably from about 20° C. to about 100° C. and most preferably from about 20° C. to about 90° C. The stack can be heated by rod heaters or blanket heaters attached either directly to the stack elements or to the shells. Preferably the ceramic stack in the convex transducer has about the same stress as the ceramic stack in the concave transducer under the operating conditions of the electroacoustic transducer assembly. The concave and convex transducers are generally similar in that they are both flexural devices suited for low frequency, broad band applications however there are some differences. Nearly all of the surface of the convex shell is in phase which causes a higher volume velocity and mass loading which tends to reduce the resonant frequency and increase the bandwidth when compared to a similar sized concave shell. Concave and convex shells can be designed to use identical driver stacks, or may be similar in size, to facilitate mechanical assembly, and have individual resonant frequencies which are similar but not identical. By designing a dual resonant system where the two resonances differ slightly, the effective bandwidth of the transducer can be nearly doubled.

Figure 5:
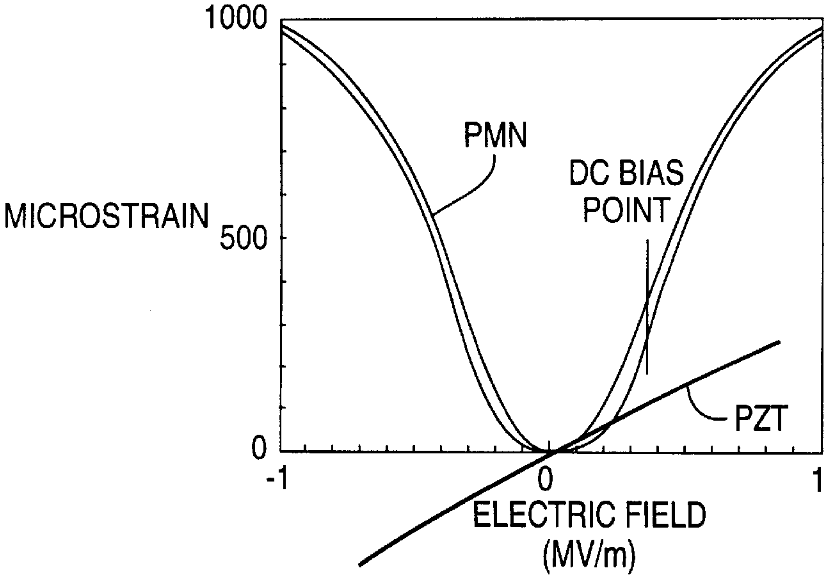
FIG. 5 shows typical strain curves for both PMN and PZT ceramics.

The preferred PMN ceramic is a ferroelectric material and exhibits a quadratic strain vs. voltage curve. FIG. 5 shows typical strain curves for both PMN and PZT ceramics. The high strain rate of PMN is exemplified by the steep slope of the strain/field curve. In order to operate PMN in the linear strain region it must be biased with a DC voltage while the AC drive signal is applied. FIG. 6 shows an electrical schematic diagram of prior art circuitry. The prior art circuit includes a DC power supply across the terminals of the transducer and a large series capacitor between the DC bias and the transformer. The capacitor acts as an infinite impedance for the DC, thus preventing the supply from shorting out, but it also, unfortunately, acts as a voltage divider reducing the drive voltage on the transducer. To minimize this effect the capacitor is sized at least five times the capacitance of the transducer. Thus the passive drive circuitry becomes a significant contributor to the size and weight of a PMN transducer. Typical prior art 2.5 kHz PMN transducers weigh 22 lbs. while the blocking capacitor weighed 6.5 lbs. and occupied a volume nearly 50% that of the transducer. A primary benefit of the split bias, push-pull technique of the present invention is that it does not require a bias capacitor.

The stacks are provided with suitable electrical connection to a driving voltage. FIG. 7 shows the drive circuitry for the split bias transducer according to the invention. The significant difference is that the transducer assembly is split into two segments which are electrically in series with the high potential side of the DC bias applied between the segments. Each segment provides the infinite DC impedance necessary to prevent shorting of the DC signal. As can be seen, the convex transducer is electrically connected in series with the concave transducer. The transducer assembly preferably has biasing means for providing a first electrical signal to polarize the ceramic stacks such that one ceramic stack is positively biased and the other ceramic stack is negatively biased. Thus one positively direct current biases the convex transducer or the concave transducer and oppositely negatively direct current biases the concave transducer or the convex transducer. Means are also provided for applying an alternating current driving signal to each of the convex transducer and the concave transducer. This generates acoustically in-phase output signals from each transducer. The AC drive signal is applied across the two transducer segments in series. The transducers are designed to present similar electrical impedances to the drive voltage which will then be split between them and their output will be comparable. Impedances of the two may be the same or different, however variations of as much as 30% are tolerable. In the transducer assembly the concave transducer and the convex transducer preferably have different resonant frequencies. A second benefit of the split bias approach is that the overall transducer impedance is increased by a factor of four thus reducing current in the connecting cable. Because PMN has such a high relative dielectric it presents a very low electrical impedance to the amplifier and requires very high current. Transducers are typically wired with all the drivers in parallel which further decreases the impedance. Thus the split bias technique doubles the required drive voltage level while quadrupling the impedance and eliminates the need for a separate blocking capacitor component. This reduces overall system size, weight, and complexity and yields a higher impedance transducer which is better matched to common amplifiers.

FIG. 8 shows a strain vs. field curve which shows how each of the two transducer segments are electrically biased and driven. FIG. 9 shows the combined AC-DC voltage on each of the two segments. Note that the AC drive on the two segments is in phase but that the DC bias is opposite in polarity. As the AC drive signal increases the combined electrical field on first transducer segment increases while the combined field on the second transducer segment decreases. The motion of both ceramic stacks is shown on the strain vs. field curve. As the field on the first transducer segment increases the strain is positive (the stack expands). Because the second transducer segment is negatively biased the increasing drive voltage reduces the electrical field and the strain is negative (the stack contracts). The split bias technique causes the two driver segments to operate 180 degrees out of phase with one another. One would expect that this would normally result in a cancellation of radiated energy, however the split bias drivers in a push-pull transducer configuration according to the invention causes the radiating shells of the two segments to operate in phase.

Figure 10:
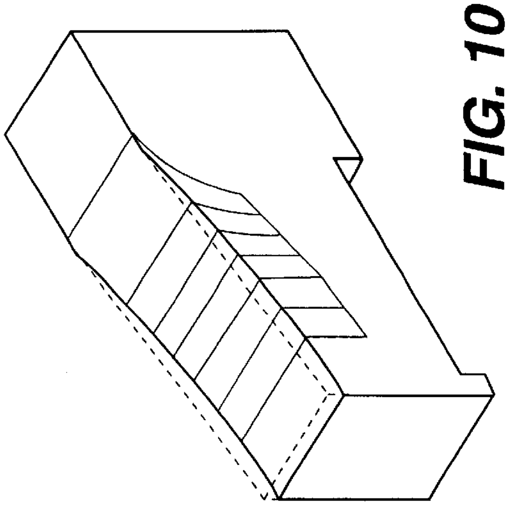
FIG. 10 illustrates a simulation of the stress on a transducer segment by finite element analysis.
Figure 11:
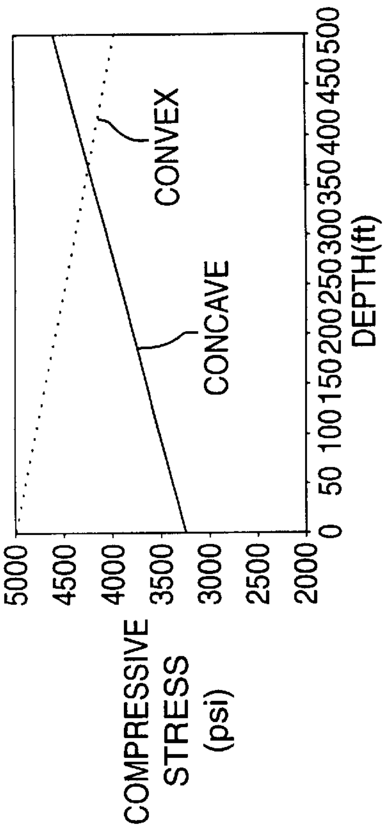
FIG. 11 shows the computed ceramic stress levels as a function of water depth in both the convex segment and concave shell for one embodiment of the shell designs.

In use the output signal from the ceramic stack is presented to a fluid medium such as sea water. As the hydrostatic load on a transducer changes due to depth, the shell deforms and the axial stress in the ceramic driver changes. Flextensional transducers are preferably constructed to provide a compressive preload on the ceramic which is sufficient to compensate for any tensile stresses induced by hydrostatic load or dynamic drive conditions. With a convex shell the ceramic prestress is reduced as hydrostatic load is increased. Because of the inverted shell shape, a concave shell causes the compressive prestress on the ceramic to increase with depth. This effect is simulated with finite element analysis of the transducer as shown in FIG. 10. Because the electrostrictive properties of PMN vary slightly with stress it is desirable to have similar levels of stress in both shell segments. FIG. 11 shows the computed stress levels as a function of depth in both the convex segment and concave shell for one embodiment of the shell designs. For every 100 ft of increased depth 200 psi compressive stress is relieved from ceramic in the convex shell while 270 psi of stress is added to the ceramic in the concave shell. With this information the initial prestress levels can be set such that when the transducer is at the designed operating depth the ceramic drivers will be at the same stress level. Data taken at different depths show a very slight change in dielectric as a function of stress. However, because the two shell segments have different radiation impedances and the segments are intended to have different resonances and impedances, the effects due to stress variations may be considered insignificant.

Electrical analysis of the split bias transducer may determine tolerable impedance differences between segments. Referring to the circuit in FIG. 7, the drive signal is applied across the two segments which are electrically in series. When the transducer is driven with a constant voltage source the signal is split between the segments. If the impedances are identical the voltage is divided equally. As the impedance of one segment decreases relative to the other, the voltage applied across that segment also decreases. The effect of reducing the voltage is to reduce the output power. The DC bias preferably ranges from about 5 to about 20 volts per mil of ceramic in the stack. The AC drive voltage preferably ranges from about 2 to about 12 volts per mil of ceramic in the stack. However, the AC drive voltage is selected such that the total DC plus AC voltage is never negative.

By intentionally designing the two segments to have different resonances one may ensure that the impedances will also be different. Because the impedance of a transducer is minimum near its resonant frequency this will have the effect of reducing the output of the resonant transducer while increasing the output of the non resonant segment. Thus the push-pull concept has a built in stabilizing effect which reduces the risk of overdriving a segment beyond its stress limit.

Figure 12:
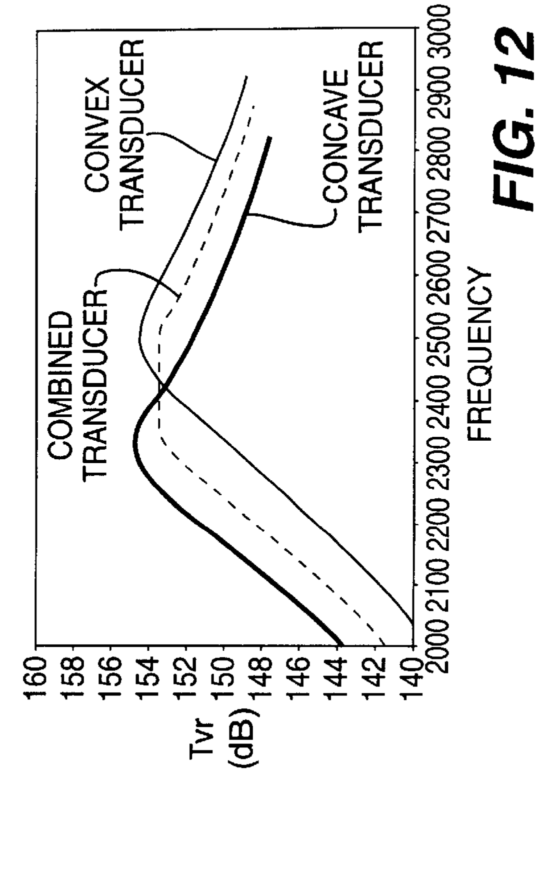
FIG. 12 shows representative transmit response performance by coupling slightly different resonant segments in one high power projector.

The push-pull transducer assembly is intended to provide extended bandwidth coverage by coupling slightly different resonant segments in one high power projector. Representative transmit response performance is shown in FIG. 12. The combined response curve shows characteristics of each segment and a flat response between the resonance peaks. The resulting bandwidth can be nearly twice that of a typical flextensional transducer.

Figure 13:
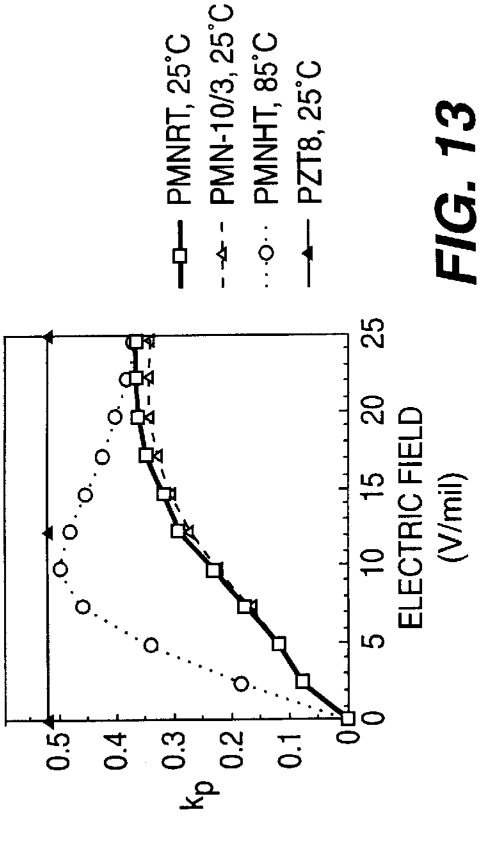
FIG. 13 shows the planar coupling for three different PMN ceramics as well as for PZT8 plotted vs. electric field.

In all electro-acoustic transducers, high voltage fields can hasten insulation breakdown and lead to failure of the transducer. Because PMN requires a DC bias in addition to the AC drive signal the voltage fields can sometimes exceed those commonly found in PZT device. In PMN ceramics performance characteristics such as planar coupling (kp) and dielectric are functions of electric field; the DC bias field is selected to maximize these properties. FIG. 13 shows the planar coupling for three different PMN ceramics as well as for PZT8 plotted vs. electric field. The preferred 85° C. material exhibits coupling comparable to PZT and the has the best performance near 10 V/mil. The other PMN ceramics have much lower coupling and show optimal performance at very high fields (around 22 V/mil). The preferred ceramic is high temperature PMN for its exceptional electrostrictive properties and because these properties are exhibited at reasonable electric field levels.

Whether this transducer assembly is part of a towed body or a soft tow vertical array, the reduced size and weight of the OS push pull transducer facilitates deployment. For example, a 2.5 kHz baseline transducer which would produce 209 dB (6.6 kW) with a bandwidth of roughly 700 Hz, could be packaged into an eight inch diameter hose to form a soft tow line array of projector sources.

Figure 14:
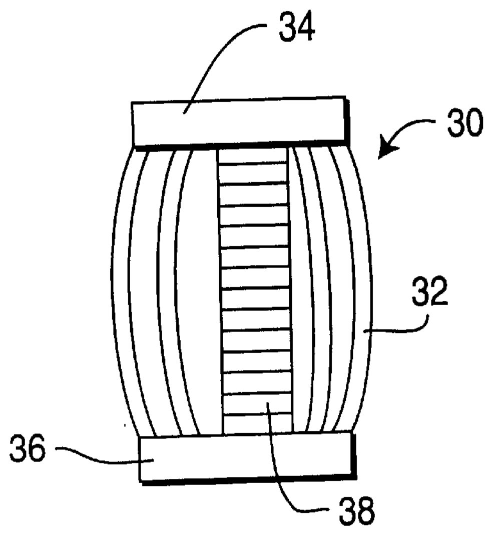
FIG. 14 shows another embodiment of the invention which uses a convex barrel stave type transducer.
Figure 15:
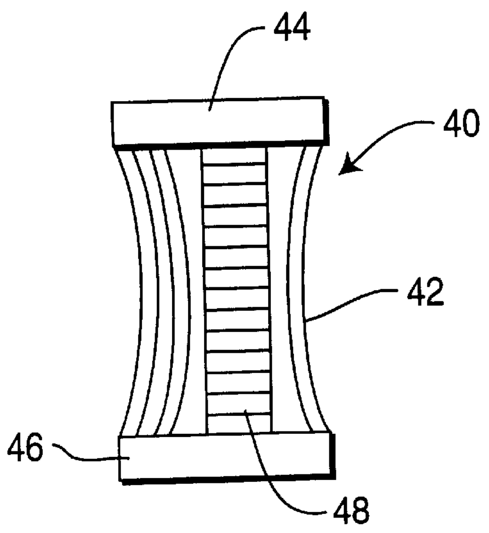
FIG. 15 shows another embodiment of the invention which uses a concave flextensional transducer.
Figure 16:
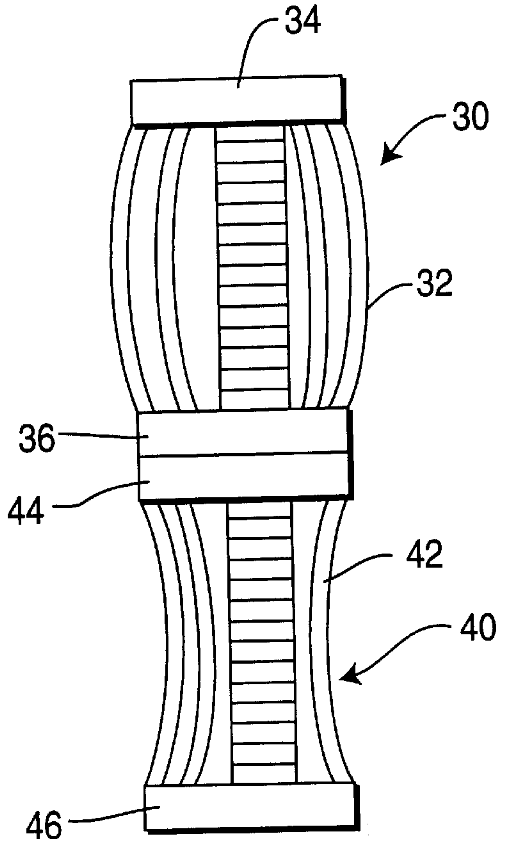
FIG. 16 shows an assembled push-pull electro-acoustic transducer assembly wherein a convex transducer is attached to a concave transducer via end plates.

FIGS. 14, 15 and 16 show another embodiment of a push-pull electro-acoustic transducer assembly. FIG. 14 shows a convex barrel stave type transducer 30 which has a hollow, generally parabolic shell of revolution comprising a plurality of convex side wall staves 32 having ends which are attached at endplates 34 and 36 at opposing ends of the parabolic shell. In the center of the shell is a piezoelectric ceramic stack 38 which extends between the opposing endplates 34, 36 and is capable of exerting a force on the opposing endplates 34, 36 and strain the convex side wall staves 32 when the stack 38 is subjected to sufficient driving voltage through electrodes bonded to the stack.

FIG. 15 shows a concave flextensional transducer 40 which comprises a hollow, generally hyperbolic shell of revolution comprising a plurality of concave side wall staves 42 having ends which are attached at endplates 44 and 46 at opposing ends of the hyperbolic shell. A piezoelectric ceramic stack 48 is positioned in the hollow, hyperbolic shell and extends between the opposing ends. The stack 48 is adapted to exert a force on the opposing endplates 44, 46 and strain the concave side wall staves 42 when the stack is subjected to sufficient driving voltage through electrodes bonded to the stack.

FIG. 16 shows an assembled push-pull electro-acoustic transducer assembly wherein a convex transducer 30 is attached to a convex transducer 40 via end plates 36 and 44. In another alternative, an endplate of the concave transducer is also an endplate of the concave transducer. The operation of the transducer assembly of FIG. 16 is as the transducer assembly of FIG. 1. The transducer assembly of FIG. 16 may be employed in a drive circuit of FIG. 7 in a similar fashion to the transducer assembly of FIG. 1 wherein the ceramic stacks of the convex barrel stave type transducer 30 and concave flextensional transducer 40 are electrically attached in series and are oppositely DC biased as shown in FIG. 7. Again, although their mechanical displacments are out of phase when the AC drive voltage is applied, the inverted shell shapes cause in phase acoustic radiation. It is within the contemplation of the invention that more than one of the transducer assemblies according to FIG. 1 or 16 or combinations of each of the transducer assemblies according to FIGS. 1 and 16 may be attached to one another by their endplates or on a common frame to provide an array of transducer assemblies. In such a case they would be connected electrically in the same manner as before and the separation of the assemblies could be, for example, one fourth or one half a wavelength based on the acoustic operating frequency of the transducers.

Figure 17:
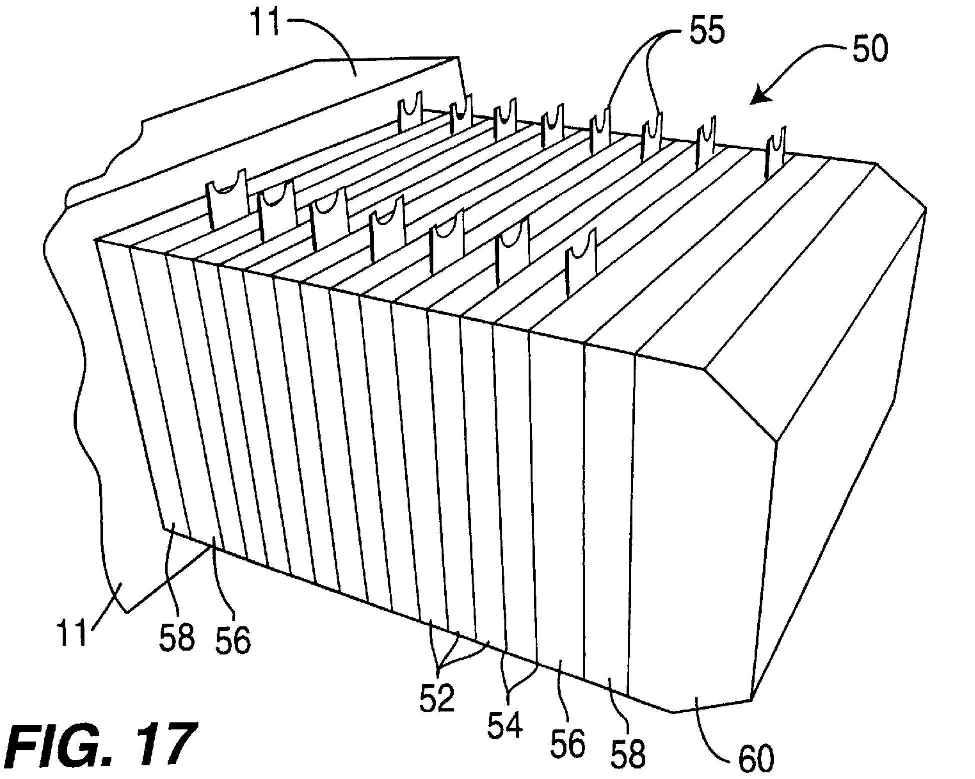
FIG. 17 shows an improved transducer stack according to the invention.

FIG. 17 shows one end of an improved transducer stack 50 according to the invention which is useful for any of the transducer assemblies and transducer drive circuits disclosed herein. The stack has a series of piezoelectric ceramic elements or plates 52 each having a substantially equivalent thickness. Each of the elements 52 is attached to the next element through a thin intermediate electrically conductive electrode 54 which is preferably composed of a beryllium copper alloy. Preferably extending from each conductive electrode 54 is an electrical connector 55 which are alternately oppositely electrically biased. Attached to the last piezoelectric element is a terminal piezoelectric ceramic member 56 via another intermediate electrically conductive electrode. Each terminal piezoelectric member has a thickness which is about 25% or more greater, preferably 25% to 75% greater than the thickness of the stack elements 52. Attached to the thicker terminal piezoelectric member 56 is an electrically insulating segment 58 preferably also via another intermediate electrically conductive electrode. The thick electrically insulating segment 58 may be any suitable thickness such as approximately the same thickness as the stack elements 52. Preferably on the opposite side of the electrically insulating segment 58 is a thick metal member 60 which attaches to the transducer shell, not shown. The thick metal member 60 is at about twice as thick, preferably about 2 to about 3 times as thick, as the stack elements 52. A similar arrangement is on the opposite side of the transducer stack 50. This arrangement of a sequential thicker terminal piezoelectric member 56, thick electrically insulating ceramic segment 58 and thick metal bar member 60 is found to relieve stresses and fractures induced by the vibration of the transducer stack 50. Since the entire stack operates at the same voltage, the thicker terminal piezoelectric member 56 has a lower electric field, i.e. a lower volt per unit thickness ratio and hence flexes to a lesser degree than the stack elements 52. The insulating segment 58 and thick metal bar member 60 thus provide a transition to the surrounding shell. Another the thicker terminal piezoelectric member 56 and insulating segment 58 may be positioned next to center support 11 when one is present. The result is relief of stress and less stress induced fracturing and a higher threshold of voltage and power level before any damage.

Figure 18:
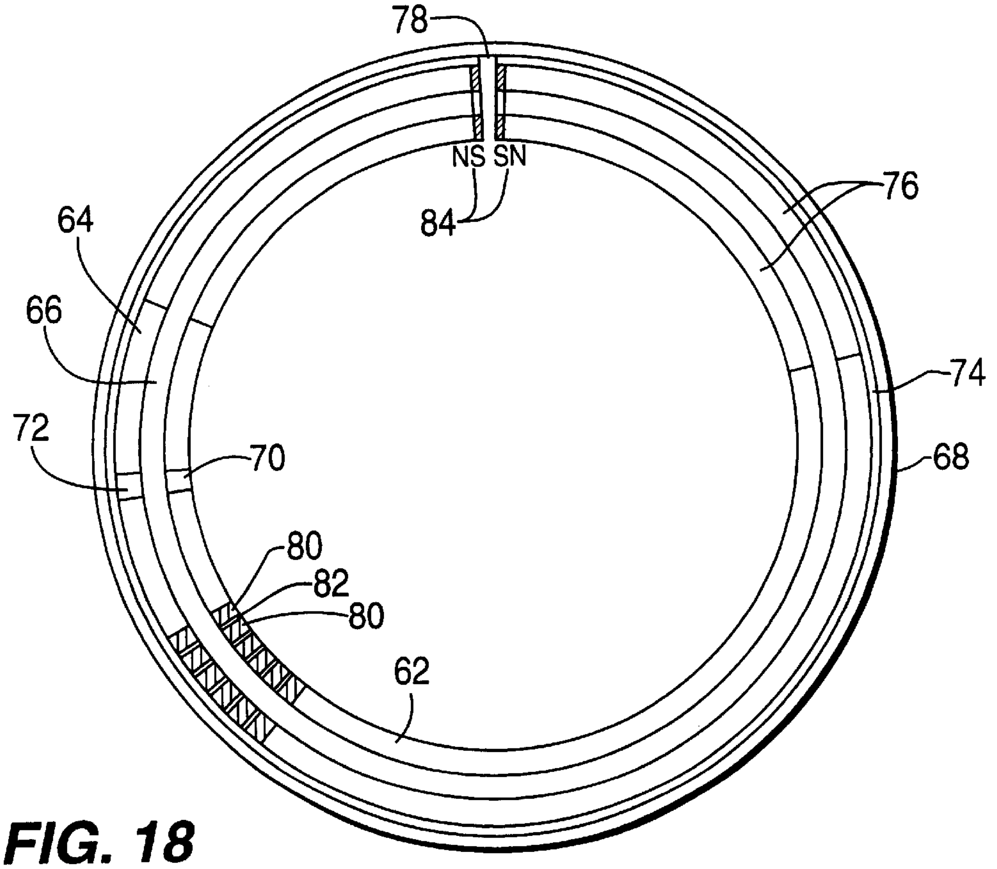
FIG. 18 shows a slotted cylinder transducer according to the invention.

FIG. 18 shows a push-pull slotted cylinder transducer according to the invention. It has an inner piezoelectric slotted cylinder 62 and an outer concentric piezoelectric slotted cylinder 64. The two piezoelectric slotted cylinders 62 and 64 are separated by an intermediate concentric nonpiezoelectric slotted cylinder 66 which may be metal, plastic or fiber reinforced plastic. The slotted cylinders are enclosed by an insulating boot 68. Electrodes 70 and 72 are provided for applying sufficient driving voltage to the piezoelectric slotted cylinders. Preferably a voltage of one polarity to the inner piezoelectric slotted cylinder and a voltage of an opposite polarity to the outer piezoelectric slotted cylinder. The outer piezoelectric slotted cylinder 64 is preferably attached to the insulating boot 68 by an intermediate insulating material 74 which may be a fiber-epoxy composite.

In another embodiment of the invention, the inner and outer piezoelectric slotted cylinders 62 and 64 may each comprise one or more regions of a nonpiezoelectric material 76. These regions of a nonpiezoelectric material may be located adjacent to slot 78 or elsewhere around the cylinders. Optionally, the inner and outer piezoelectric slotted cylinders may comprise a plurality of piezoelectric ceramic elements 80, each of which is attached to the next element 80 through an intermediate electrically conductive electrode 82 which may be composed of a metal such as brass. In a preferred embodiment, the inner and outer piezoelectric slotted cylinders 62 and 64 each comprise a pair of permanent magnets 84 attached adjacent to the slot 78 such that the magnets are positioned with their polarities configured to repel one another. Such magnets resist gap closure and serve to increase the ability of the transducer to withstand hydrostatic pressure when deployed in deep water. Such a transducer has increased acoustic power density, increased bandwidth and increased deep water deployment capability. This push-pull slotted cylinder transducer may likewise be used in a transducer circuit as described above.

The resulting transducer assemblies and drive circuits thus provide improvements in system size and weight by eliminating the blocking capacitors and significant increases in operating bandwidth.

What is claimed is:

1. A stack of piezoelectric ceramic elements, each having a substantially equivalent thickness, each of said elements being attached to the next element through an intermediate electrically conductive electrode; a terminal piezoelectric ceramic member attached on one side thereof to at least one end of said stack through an intermediate electrically conductive electrode, each terminal piezoelectric member having a thickness which is about 25% or more greater than the thickness of said elements; and an electrically insulating segment attached to each terminal piezoelectric member on an opposite side of said member.

2. The stack of claim 1 further comprising a metal element attached to each electrically insulating segment on a side of the electrically insulating segment opposite to the each terminal piezoelectric member.

3. The stack of piezoelectric ceramic elements of claim 1 wherein the ceramic stack comprises lead magnesium niobate.

4. The stack of piezoelectric ceramic elements of claim 1 wherein the ceramic stack comprises lead magnesium niobate-lead titanate.

5. The stack of piezoelectric ceramic elements of claim 1 wherein the ceramic stack comprises lead magnesium niobate having a Curie temperature Tm approximately equal to the operating temperature of the electro-acoustic transducer.

6. The stack of piezoelectric ceramic elements of claim 1 further comprising means for transmitting an output signal from said ceramic stack to a fluid medium.

7. A transducer which comprises a hollow shell comprising a pair of side walls meeting at opposing ends; a piezoelectric ceramic stack positioned in the hollow shell and extending between the opposing ends and adapted to exert a force on the opposing ends and strain the side walls when the stack is subjected to sufficient driving voltage through electrodes bonded to the stack; said stack comprises a plurality of piezoelectric ceramic elements, each having a substantially equivalent thickness, each of said elements being attached to the next element through an intermediate electrically conductive electrode; a terminal piezoelectric ceramic member attached on one side thereof to at least one end of said stack through an intermediate electrically conductive electrode, each terminal piezoelectric member having a thickness which is about 25% or more greater than the thickness of said elements; and an electrically insulating segment attached to each terminal piezoelectric member on an opposite side of said member.

8. The transducer of claim 7 further comprising a metal element attached to each electrically insulating segment on a side of the electrically insulating segment opposite to the each terminal piezoelectric member.

* * * * *